United States Patent
Nakajima et al.

(10) Patent No.: US 6,331,727 B1
(45) Date of Patent: Dec. 18, 2001

(54) SEMICONDUCTOR DEVICE AND METHOD OF FABRICATING THE SAME

(75) Inventors: Hiroomi Nakajima, Yokohama; Toshihiro Sakamoto, Kitakyushu, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/369,470

(22) Filed: Aug. 6, 1999

(30) Foreign Application Priority Data

Aug. 7, 1998 (JP) .................................................. 10-223865
Aug. 31, 1998 (JP) .................................................. 10-245431
Jul. 23, 1999 (JP) .................................................. 11-209064

(51) Int. Cl.[7] .......................... H01L 29/78; H01L 27/102; H01L 27/082
(52) U.S. Cl. ......................... 257/587; 257/588; 257/592
(58) Field of Search .................................. 257/587, 588, 257/592

(56) References Cited

U.S. PATENT DOCUMENTS

| | | |
|---|---|---|
| 4,853,342 * | 8/1989 | Taka et al. . |
| 5,091,760 * | 2/1992 | Maeda et al. . |
| 5,471,083 * | 11/1995 | Ikeda et al. . |
| 5,877,540 * | 3/1999 | Naruse et al. . |
| 6,001,676 * | 12/1999 | Sawada et al. . |

FOREIGN PATENT DOCUMENTS 10-321639    12/1998  (JP) .

* cited by examiner

Primary Examiner—Stephen D. Meier

(74) Attorney, Agent, or Firm—Pillsbury Winthrop LLP

(57) ABSTRACT

This invention includes a semiconductor substrate of one conductivity type having a semiconductor layer of an opposite conductivity type from an upper surface to a predetermined depth and first and second projections on the semiconductor layer of the opposite conductivity type, a first insulating film formed on an upper surface of the semiconductor substrate of one conductivity type from a portion except for the first and second projections to a predetermined level not reaching upper surfaces of the first and second projections, a semiconductor film of one conductivity type formed on at least the upper surface of the first projection, a first semiconductor film of the opposite conductivity type formed on at least the upper surface of the second projection, and a second semiconductor film of the opposite conductivity type formed in a predetermined position on an upper surface of the semiconductor film of one conductivity type. This structure allows an emitter to be formed without any alignment. In this invention, a p-type silicon layer corresponding to a base region and an n-type silicon layer corresponding to an emitter region are formed to be self-aligned with an element region (n-type heavily doped impurity region) corresponding to a collector layer. This makes alignment margin between these regions unnecessary and reduction of the element area possible. Unlike in conventional devices, almost no parasitic capacitances exist between an emitter electrode and a base electrode. This achieves high operating speed.

8 Claims, 16 Drawing Sheets

SEMICONDUCTOR DEVICE AND METHOD OF FABRICATING THE SAME

BACKGROUND OF THE INVENTION

The present invention relates to a semiconductor device and a method of fabricating the same and, more particularly, to the structure of a bipolar transistor and a method of fabricating the same.

Recently, bipolar transistors are used in a wide variety of applications such as computers, optical communications, and various analog circuits. The following references have proposed bipolar transistors using the epitaxial techniques. The cutoff frequency of these bipolar transistors fabricated on an experimental basis almost reaches 60 GHz.

(1) IEEE Trans on Electron Device, Vol. ED-38, Feb. 1991, p. 378
(2) IEDM'90, p. 13
(3) Japanese Patent Laid-Open No. 05-175222

A method of fabricating an npn bipolar transistor according to one prior art will be described below with reference to the accompanying drawings (FIGS. 1 to 14).

First, as shown in FIG. 1, an n$^+$-type diffusion layer 2 is formed on a p-type silicon substrate 1 using, e.g., ion implantation. Epitaxial growth is then used to form an n$^+$-type silicon layer 3 on the upper surface of the n$^+$-type diffusion layer 2 formed on the p-type silicon substrate 1. Next, by a predetermined etching step, a shallow trench about a few hundred nm deep is formed. A normal film formation step and planarization process are used to bury an insulating film 4, such as a silicon oxide film, in this shallow trench. Consequently, an element isolation region is completed.

Next, as shown in FIG. 2, epitaxial growth is used to form a p-type silicon film 5 as a base electrode on the entire surface. In addition, a silicon oxide film 6 is formed on the entire surface using CVD. Spin coating is then used to form a resist (not shown) on the upper surface of the silicon oxide film 6. This resist is patterned into a predetermined shape by using photolithography. Furthermore, this resist is used as a mask to pattern the silicon oxide film 6 into a predetermined shape by RIE. After that, the resist (not shown) is removed by ashing.

As illustrated in FIG. 3, CVD is used to form a polysilicon film on the entire surface. Ion implantation is then performed to dope a p-type impurity, e.g., B (boron) into the entire surface. This B (boron) is thermally diffused to change the polysilicon film into a p-type impurity doped polysilicon film 7 (to be referred to as a "p-type polysilicon film 7" hereinafter).

As shown in FIG. 4, spin coating is used to form a resist 8 on the upper surface of the p-type polysilicon film 7. This resist 8 is patterned into a predetermined shape by using photolithography.

As depicted in FIG. 5, the resist mask 8 is used as a mask to etch the p-type polysilicon film 7 and the p-type silicon film 5 by anisotropic etching, e.g., RIE. During this etching, the insulating film 4 is used as an etching stopper. After that, the resist 8 is removed by ashing.

As shown in FIG. 6, a resist 9 is formed on the entire surface by using spin coating. This resist 9 is formed into a predetermined shape by using photolithography. Furthermore, ion implantation is performed using the resist 9 as a mask to dope an n-type impurity, e.g., P (phosphorus) into the entire surface. Consequently, a portion of the p-type polysilicon film 7 on which the resist 9 is not formed and the p-type silicon film 5 below this portion form an n-type polysilicon film 10 and an n-type silicon film 11, respectively.

As illustrated in FIG. 7, the resist 9 is removed by ashing. CVD is used to form a silicon oxide film 12 on the entire surface. CVD is used again to form a silicon nitride film 13 on the entire surface.

As shown in FIG. 8, a resist (not shown) patterned into a predetermined shape on the upper surface of the silicon nitride film 13 is used as a mask to etch the silicon nitride film 13 and the silicon oxide film 12 by RIE. This exposes a portion of the upper surface of the p-type polysilicon film 13. In addition, the silicon nitride film 13 is used as a mask to etch the p-type polysilicon film 7 by RIE. Consequently, a contact hole 14 is formed to partially expose the upper surface of the silicon oxide film 6.

Next, a step shown in FIG. 9 is performed. That is, CVD is used to form a silicon nitride film 15 on the entire surface. This silicon nitride film 15 is etched by using anisotropic etching, e.g., RIE. Consequently, the silicon nitride film 15 remains only on the side surfaces of the contact hole 14, and the upper surface of the silicon oxide film 6 is partially exposed. This exposed portion of the silicon oxide film 6 is removed by wet etching to expose the p-type silicon film 5.

As shown in FIG. 10, CVD is used to form a polysilicon film on the entire surface. Ion implantation is then performed to dope an n-type impurity, e.g., As (arsenic) into the entire surface by using the silicon nitride films 13 and 15 as masks. This As (arsenic) is thermally diffused to change the polysilicon film into an n-type polysilicon film 16.

As shown in FIG. 11, a resist (not shown) patterned into a predetermined shape on the upper surface of the n-type polysilicon film 16 is used as a mask to etch the n-type polysilicon film 16 by anisotropic etching, e.g., RIE. This etching is so performed that the n-type polysilicon film 16 is buried in the contact hole 14. Also, in this etching step, the silicon nitride film 13 is used as an etching stopper. After the etching, the resist (not shown) is removed by ashing.

Next, a step shown in FIG. 12 is performed. That is, a resist (not shown) is patterned into a predetermined shape on the entire surface by exposure and development. This resist and the n-type polysilicon film 16 are used as masks to etch the silicon nitride film 13 and the silicon oxide film 12 into a predetermined shape by anisotropic etching, e.g., RIE. During this etching, the p-type polysilicon film 7 and the n-type polysilicon film 10 are used as etching stoppers. After the etching, the resist (not shown) is removed by ashing.

As depicted in FIG. 13, a titanium film is formed on the entire surface by sputtering. Annealing is then performed to react this titanium film with the p-type polysilicon film 7, the n-type polysilicon film 16, and the n-type polysilicon film 10. Consequently, a titanium silicide film 17 is formed.

Finally, as shown in FIG. 14, CVD is used to form a TEOS film 19 on the entire surface. After that, although not shown, a contact is formed in this TEOS film 9 where necessary.

An npn bipolar transistor is formed as described above. The structure of this npn bipolar transistor will be described below with reference to FIG. 14. Referring to FIG. 14, a base extraction electrode is constructed of the p-type silicon film 5 and the p-type polysilicon film 7. An emitter extraction electrode is made of the n-type polysilicon film 16. A collector region is composed of the n-type silicon layer 3 and the n$^+$-type diffusion layer 2. A collector extraction electrode is made up of the n-type silicon film 11 and the n-type polysilicon film 10.

The width of the n-type silicon layer 3 below the p-type silicon film 5 is about 900 nm. The width of the n-type silicon layer 3 below the n-type polysilicon film 10 as a collector is about 1,400 nm. The width of the insulating film 4 sandwiched between these n-type silicon layers 3 is about 2,400 nm. Furthermore, a distance of about 1,000 nm is necessary between this npn bipolar transistor and each of element isolation regions so formed as to sandwich the transistor. Accordingly, the width of the whole element is about 6 to 7 μm.

In this prior art, as already shown in the step of FIG. 8, to form the n-type polysilicon film 16 as the emitter extraction electrode, the contact hole 14 must be formed by the etching step. However, if misalignment occurs in this etching step, the formation position of the contact hole 14 deviates.

Assume, for example, that the formation position of the contact hole 14 deviates to the left in FIG. 8. In this case, when the silicon oxide film 6 is wet-etched as shown in FIG. 9, the silicon oxide film 6 on the left side of the exposed silicon oxide film 6 may be etched as well. As a consequence, the silicon oxide film 6 formed on the left of the contact hole 14 is completely etched. Therefore, when the n-type polysilicon film 16 is formed in the step shown in FIG. 10, this n-type polysilicon film 16 and the p-type polysilicon film 7 as the base extraction electrode electrically short-circuit. This makes this npn bipolar transistor unable to function as a transistor. That is, this problem arises because alignment is necessary in the formation of the emitter.

Also, in this prior art base-emitter parasitic capacitances C1 and C2 are present between the n-type polysilicon film 16 as the emitter extraction electrode and the p-type polysilicon film 7 as the base extraction electrode. That is, these parasitic capacitances C1 and C2 are formed in addition to the p-n junction capacitance inevitably existing between the intrinsic base region and the intrinsic emitter region. This interferes with high-speed operation.

SUMMARY OF THE INVENTION

It is, therefore, an object of the present invention to fabricate a fine element by forming an emitter without performing any alignment and achieve high-speed operation by reducing the base-emitter parasitic capacitance.

A semiconductor device of the present invention comprises a semiconductor substrate of one conductivity type having a semiconductor layer of an opposite conductivity type from an upper surface to a first depth, a collector layer of the opposite conductivity type formed on the surface of the semiconductor substrate, a base extraction electrode of one conductivity type formed on a surface of the collector layer and having a hole formed to a second depth, and an emitter extraction electrode of the opposite conductivity type buried in the hole of the base extraction electrode with an insulating film being formed on side surfaces of the hole, wherein an end portion of the emitter extraction electrode does not extend to an edge of the hole in the base extraction electrode.

The emitter extraction electrode preferably includes an epitaxial layer.

An upper surface of the emitter extraction electrode may be not higher than an upper surface of the base extraction electrode.

A semiconductor device of the present invention comprises a semiconductor substrate of one conductivity type having a semiconductor layer of an opposite conductivity type from an upper surface to a first depth, a collector layer of the opposite conductivity type formed on the surface of the semiconductor substrate, a base extraction electrode of one conductivity type formed on a surface of the collector layer, and an emitter extraction electrode of the opposite conductivity type formed on a surface of the base extraction electrode.

A semiconductor device of the present invention comprises a semiconductor substrate of one conductivity type having a semiconductor layer of an opposite conductivity type from an upper surface to a first depth, a collector layer of the opposite conductivity type formed on the surface of the semiconductor substrate, a base extraction electrode of one conductivity type formed on the semiconductor substrate to have a projection on a surface of the collector layer, and an emitter extraction electrode of the opposite conductivity type formed on a surface of the projection of the base extraction electrode.

A semiconductor device fabrication method according to the present invention comprises the projection formation step of forming a projection by removing a portion from a predetermined position of an upper surface of a semiconductor substrate, having a semiconductor layer of one conductivity type on an upper surface in which a semiconductor layer of an opposite conductivity type is formed, to a predetermined depth not reaching the upper surface of the semiconductor layer of one conductivity type, the step of forming a first insulating film in the portion removed in the projection formation step, the step of exposing an upper portion of the projection by removing an upper portion of the first insulating film to a predetermined depth, the step of forming a semiconductor film of one conductivity type on the projection and the first insulating film, the step of forming a second insulating film on the first insulating film and the semiconductor film of one conductivity type formed on the first insulating film such that a surface of the second insulating film is substantially flush with an upper surface of the semiconductor film of one conductivity type, and the step of forming a semiconductor film of the opposite conductivity type on an exposed portion on the semiconductor film of one conductivity type.

A semiconductor device fabrication method according to the present invention comprises the projection formation step of forming a projection by removing a portion from a predetermined position of an upper surface of a semiconductor substrate, having a semiconductor layer of one conductivity type on an upper surface in which a semiconductor layer of an opposite conductivity type is formed, to a predetermined depth not reaching the upper surface of the semiconductor layer of one conductivity type, the step of forming a first insulating film in the portion removed in the projection formation step, the step of exposing an upper portion of the projection by removing an upper portion of the first insulating film to a predetermined depth, the step of forming a semiconductor film of one conductivity type on the projection and the first insulating film, the step of forming a second insulating film on upper surfaces of the first insulating film and the semiconductor film of one conductivity type, the step of planarizing the second insulating film at a level higher than the upper surface of the semiconductor film of one conductivity type, the step of wet-etching the second insulating film to expose the upper surface of the semiconductor film of one conductivity type formed on an upper surface of the projection, and the step of forming a semiconductor film of the opposite conductivity type on the semiconductor film of one conductivity type.

A semiconductor device fabrication method according to the present invention comprises the projection formation step of forming first and second projections by removing a portion from a predetermined position of an upper surface of a semiconductor substrate, having a semiconductor layer of one conductivity type on an upper surface in which a semiconductor layer of an opposite conductivity type is formed, to a predetermined depth not reaching the upper surface of the semiconductor layer of one conductivity type, the step of forming a first insulating film in the portion removed in the projection formation step, the step of exposing upper portions of the projections by removing an upper portion of the first insulating film to a predetermined depth, the step of forming a first semiconductor film of one conductivity type on the first projection and a second semiconductor film of one conductivity type on the second projection, the step of forming a second insulating film on upper surfaces of the first insulating film and the first and second semiconductor films of one conductivity type, the step of planarizing the second insulating film at a level higher than the upper surfaces of the first and second semiconductor films of one conductivity type, the step of changing the first semiconductor film of one conductivity type formed on the first projection into a first semiconductor film of opposite conductivity type, the step of etching the second insulating film to expose the second semiconductor film of one conductivity type and the first semiconductor film of the opposite conductivity type, and the step of forming a second semiconductor film of the opposite conductivity type and a third semiconductor film of the opposite conductivity type on at least the upper surfaces of the first semiconductor film of one conductivity type and the first semiconductor film of the opposite conductivity type, respectively.

A portion of the semiconductor layer of the opposite conductivity type from the upper surface to the predetermined depth is preferably a semiconductor layer of the opposite conductivity type formed by epitaxial growth.

A semiconductor device according to the present invention comprises a semiconductor substrate of one conductivity type having a semiconductor layer of an opposite conductivity type from an upper surface to a predetermined depth and a projection on the semiconductor layer of the opposite conductivity type, a first insulating film formed on an upper surface of the semiconductor substrate of one conductivity type from a portion except for the projection to a predetermined level not reaching an upper surface of the projection, a semiconductor film of one conductivity type formed on at least the upper surface of the projection, and a semiconductor film of the opposite conductivity type formed on at least an upper surface of the semiconductor film of one conductivity type.

A semiconductor device according to the present invention comprises a semiconductor substrate of one conductivity type having a semiconductor layer of an opposite conductivity type from an upper surface to a predetermined depth and first and second projections on the semiconductor layer of the opposite conductivity type, a first insulating film formed on an upper surface of the semiconductor substrate of one conductivity type from a portion except for the first and second projections to a predetermined level not reaching upper surfaces of the first and second projections, a semiconductor film of one conductivity type formed on at least the upper surface of the first projection, a first semiconductor film of the opposite conductivity type formed on at least the upper surface of the second projection, and a second semiconductor film of the opposite conductivity type formed in a predetermined position on an upper surface of the semiconductor film of one conductivity type.

A semiconductor device of the present invention comprises a first insulating film formed in an element isolation region on a semiconductor substrate, a collector layer of a first conductivity type formed in an element region on the semiconductor substrate and having a surface higher than that of the first insulating film, a first semiconductor layer of a second conductivity type formed on the surfaces of the first insulating film and the collector layer, a second insulating film formed on a portion of the surface of the first semiconductor layer located on the first insulating film, and a second semiconductor layer of the first conductivity type formed on a portion of the surface of the first semiconductor layer located on the collector layer.

A heterojunction transistor is formed when the first semiconductor layer is formed using single-crystal silicon containing a hetero material having a smaller bandgap than that of silicon, and the second semiconductor layer is formed using single-crystal silicon containing a hetero material having a larger bandgap than that of silicon.

A semiconductor device fabrication method of the present invention comprises the steps of forming a collector layer of a first conductivity type in an element region on a semiconductor substrate, forming a first insulating film in a region except for the collector region on the semiconductor substrate such that a surface of the first insulating film is lower than that of the collector layer, forming a first semiconductor layer of a second conductivity type on the surfaces of the collector layer and the first insulating film by unselective epitaxial growth, depositing a second insulating film on a surface of the first semiconductor layer and etching the second insulating film to remove a portion corresponding to the collector region and expose the surface of the first semiconductor layer, and selectively forming a second semiconductor layer of the first conductivity type on the exposed surface of the first semiconductor layer by selective epitaxial growth.

A semiconductor device fabrication method of the present invention comprises the steps of forming a first insulating film on a semiconductor substrate and forming a hole in a prospective collector region, depositing a semiconductor layer of a first conductivity type to fill the hole and form a collector layer having a surface higher than that of the first insulating film, forming a first semiconductor layer of a second conductivity type on the surfaces of the collector layer and the first insulating film by unselective epitaxial growth, depositing a second insulating film on a surface of the first semiconductor layer and etching the second insulating film to remove a portion corresponding to the collector region and expose the surface of the first semiconductor layer, and selectively forming a second semiconductor layer of the first conductivity type on the exposed surface of the first semiconductor layer by selective epitaxial growth.

In these semiconductor devices and their fabrication methods of the present invention described above, the first and second semiconductor layers are formed to be self-aligned with the collector layer. Since no alignment margin is necessary, the element area can be reduced.

DESCRIPTION OF THE PREFERRED EMBODIMENTS

The first embodiment of the present invention will be described below with reference to the accompanying drawings (FIGS. 15 to 26). In this first embodiment, the present invention is applied to an npn bipolar transistor.

Figure 15:
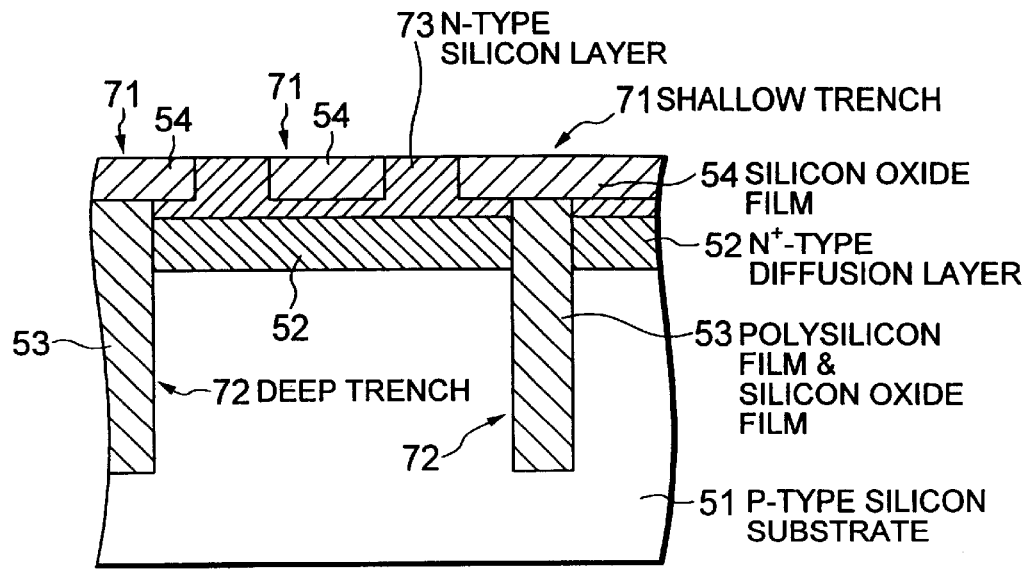
FIG. 15 is a sectional view showing a fabrication step of an npn bipolar transistor according to the first embodiment of the present invention.

First, a step shown in FIG. 15 is performed. That is, an $n^+$-type diffusion layer 52 about a few hundred nm thick is formed on a semiconductor substrate of one conductivity type, e.g., a p-type silicon substrate 51. This formation is done by using, e.g., ion implantation. Epitaxial growth is then used to form an n-type silicon layer 73 on the upper surface of the $n^+$-type diffusion layer 52 formed on the p-type silicon substrate 51. Next, by a predetermined etching step, a shallow trench 71 about several hundred nm deep and a deep trench 72 about several thousand nm deep are formed. A normal film formation step and planarization process are used to bury an insulating film, e.g., a polysilicon film 53, in this deep trench 72. In this step, it is possible to form an oxide film (not shown) on the surface of the deep trench 72 in order to enhance the element isolating effect. For this purpose, a predetermined film formation step and planarization process are used to bury an insulating film, e.g., a silicon oxide film 54 in the shallow trench 71. Consequently, an element isolation region is completed. Note that the effect of this embodiment can be obtained even when this deep trench 72 is not formed. Note also that a silicon oxide film can be used instead of the polysilicon film 53 as an insulating film to be buried in the deep trench 72. In this case, no oxide film needs to be formed on the surface of the deep trench 72 because the relative dielectric constant of a silicon oxide film is small.

Figure 16:
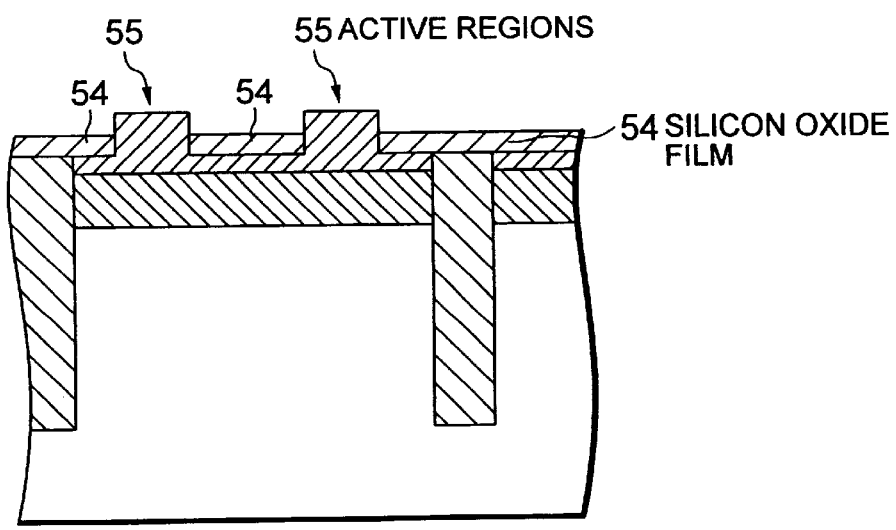
FIG. 16 is a sectional view showing a fabrication step of the npn bipolar transistor according to the first embodiment of the present invention.

Next, as shown in FIG. 16, the p-type silicon substrate 51 is used as a mask to etch the upper portion of the silicon oxide film 54 by hydrofluoric acid-based wet etching. Consequently, a step difference of about a few hundred nm is produced between the silicon oxide film 54 and active regions 55 of the transistor, thereby forming projections on the upper surface of the p-type silicon substrate 51.

Figure 17:
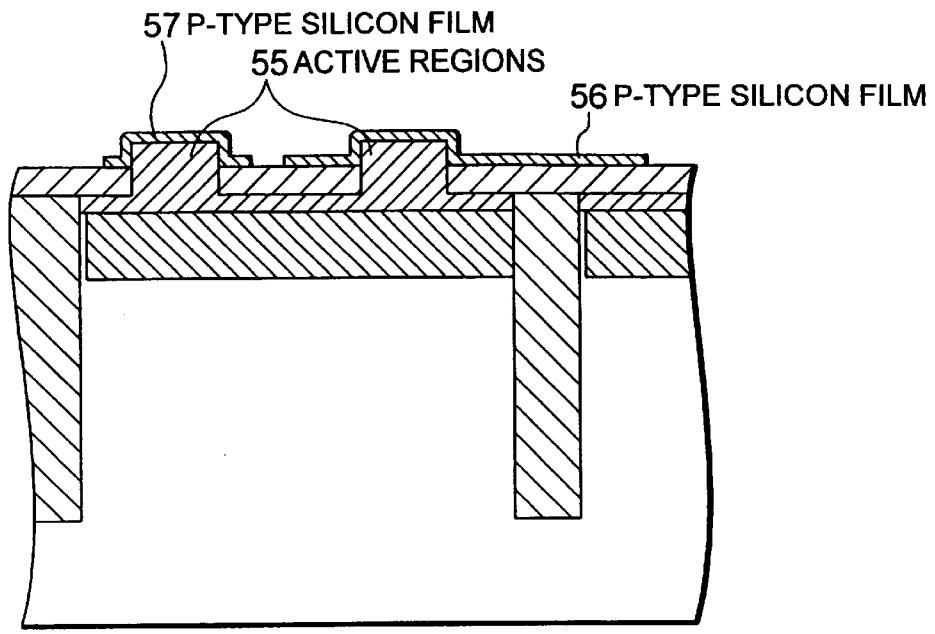
FIG. 17 is a sectional view showing a fabrication step of the npn bipolar transistor according to the first embodiment of the present invention.
Figure 26:
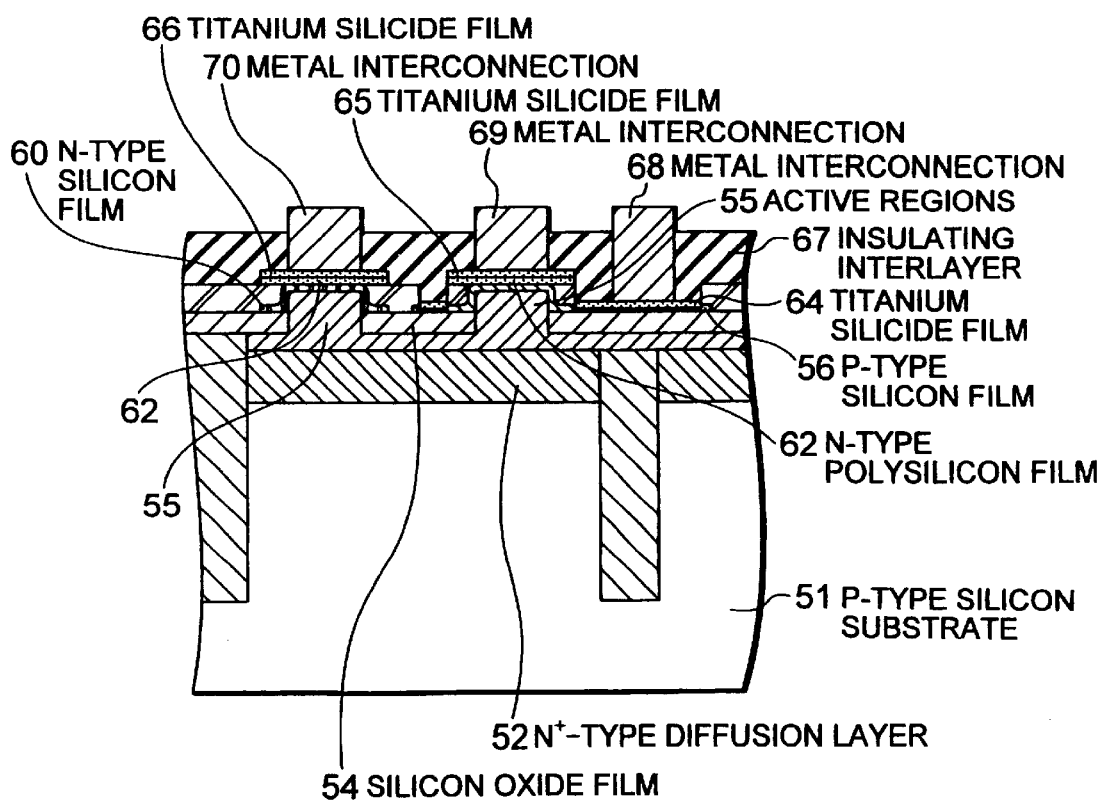
FIG. 26 is a sectional view showing a fabrication step of the npn bipolar transistor according to the first embodiment of the present invention.

Then, the step shown in FIG. 17 is performed. That is, unselective epitaxial growth is used to form a silicon film about a few hundred nm thick on the entire surface. In this epitaxial step, this silicon film is formed as a p-type silicon film by doping a p-type impurity. The upper surface of this p-type silicon film is coated with a resist (not shown) by spin coating. This resist is patterned into a predetermined shape by photolithography. The patterned resist (not shown) is used as a mask to etch the p-type silicon film by anisotropic etching, e.g., RIE, such that the p-type silicon film is left in contact with the active regions 55, thereby forming a p-type silicon film 56 as a base and a p-type silicon film 57 as a collector. This p-type silicon film 57 need not be necessarily formed. However, when this p-type silicon film 57 is formed, no step difference is produced between this portion and the upper surface of the p-type silicon film 56. This facilitates the formation of a contact in a later step (FIG. 26).

Figure 18:
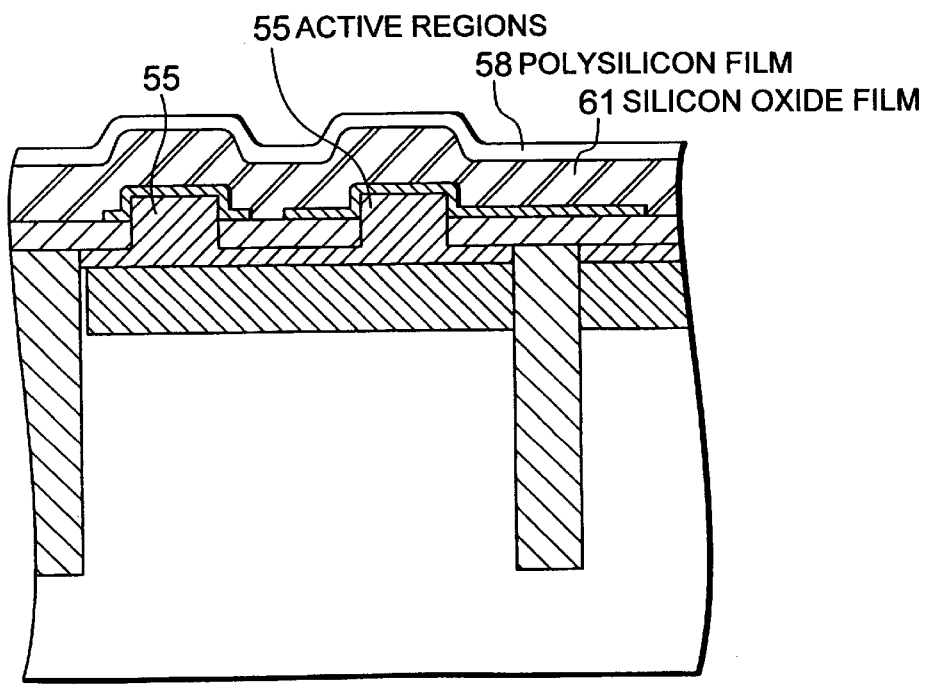
FIG. 18 is a sectional view showing a fabrication step of the npn bipolar transistor according to the first embodiment of the present invention.

As shown in FIG. 18, CVD is used to form an insulating film, e.g., a silicon oxide film 61 about several hundred nm thick on the entire surface. This silicon oxide film 61 forms projections above the active regions 55. CVD is again performed to form a polysilicon film 58 about several hundred nm thick on the entire surface. This polysilicon film 58 is used as a stopper film in a later CMP step. Hence, some other film, such as a silicon nitride film, that can function as a stopper film in the CMP step can be used in place of the polysilicon film 58.

Figure 19:
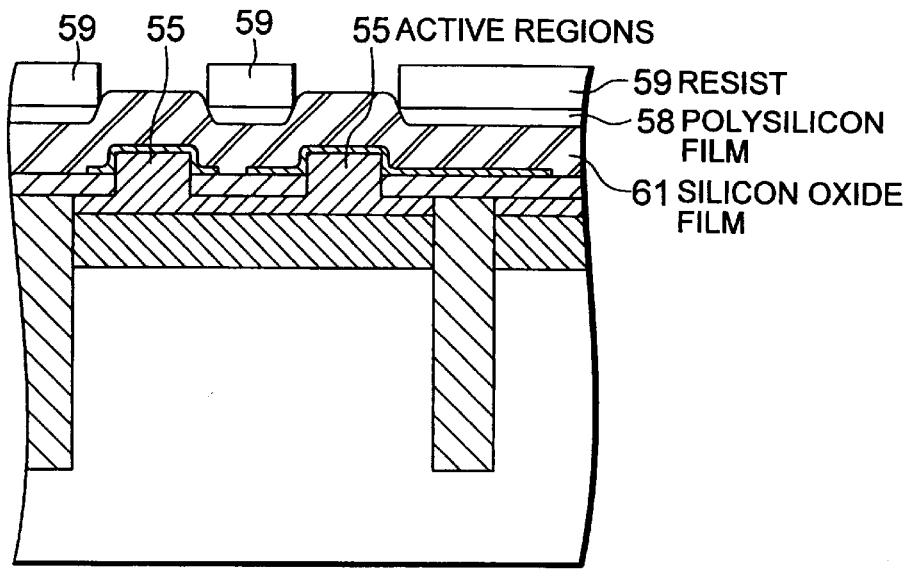
FIG. 19 is a sectional view showing a fabrication step of the npn bipolar transistor according to the first embodiment of the present invention.

As depicted in FIG. 19, spin coating is used to form a resist 59 about a few hundred nm to a few thousand nm thick on the entire surface. This resist 59 is patterned into a predetermined shape by photolithography. The resist 59 thus patterned is used as a mask to etch the polysilicon film 58 by anisotropic etching, e.g., RIE. In this manner, the polysilicon film 58 formed on the upper surfaces of the projections of the silicon oxide film 61 above the active regions 55 is removed to expose these projections of the silicon oxide film 61.

Figure 20:
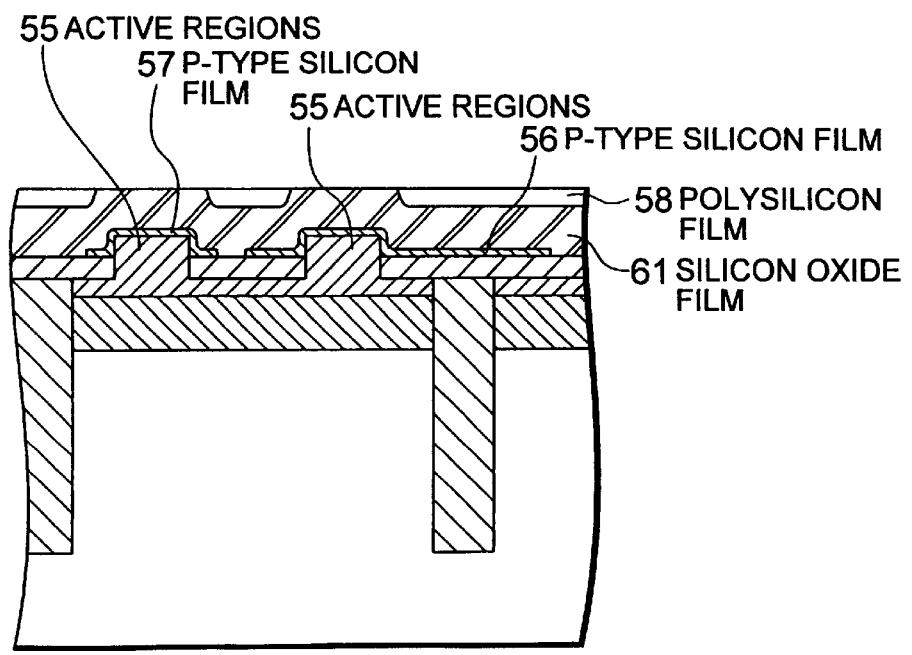
FIG. 20 is a sectional view showing a fabrication step of the npn bipolar transistor according to the first embodiment of the present invention.

As illustrated in FIG. 20, the resist 59 is removed by ashing. The polysilicon film 58 is used as a stopper mask to planarize the silicon oxide film 61 by a planarization process, e.g., CMP. This planarization process is performed such that the surfaces of the p-type silicon film 56 and the p-type silicon film 57 are not exposed. This is to prevent damages such as scratches to the active regions 55 in this planarization process, to protect the active regions 55 in an etching step shown in FIG. 21, and to use these films as buffer films in an ion implantation step shown in FIG. 21.

Figure 21:
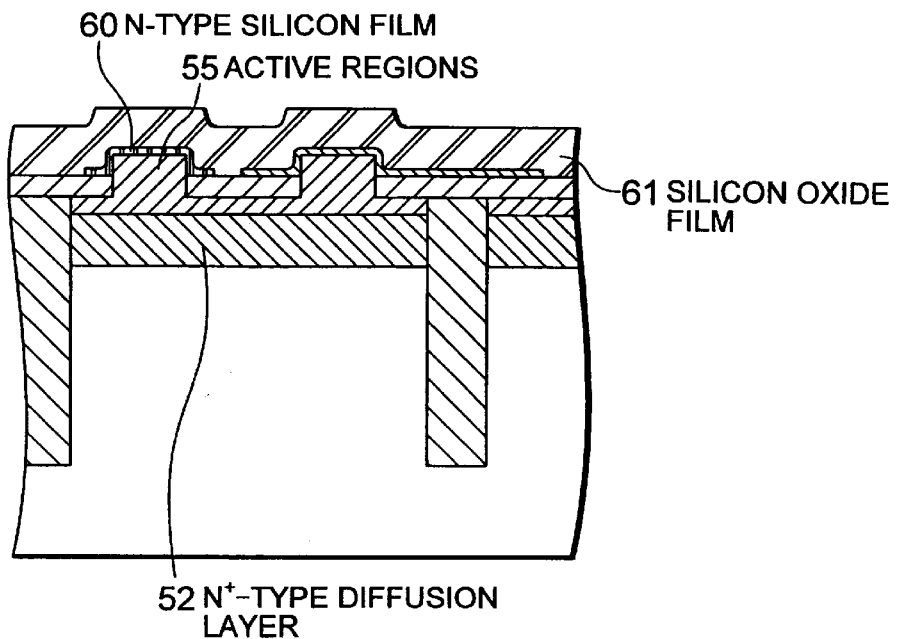
FIG. 21 is a sectional view showing a fabrication step of the npn bipolar transistor according to the first embodiment of the present invention.

As shown in FIG. 21, the polysilicon film 58 is removed under conditions by which etching selectivity is obtained between this polysilicon film 58 and the silicon oxide film 61, e.g., by using down-flow etching. In addition, spin coating is used to form a resist (not shown) on the entire surface. This resist is patterned into a predetermined shape by photolithography. Ion implantation is performed using the patterned resist as a mask to dope an n-type impurity, e.g., P (phosphorus) into a portion of the p-type silicon film 57 above the active region 55. This changes the p-type silicon film 57 into an n-type silicon film 60. Consequently, while a p-n junction is previously formed between the p-type silicon film 57 and the n$^+$-type diffusion layer 52, both the n-type silicon film 60 and the n$^+$-type diffusion layer 52 become n-type regions. As (arsenic) or the like can be used instead of P as the n-type impurity to be implanted into the active regions 55. However, since P has a larger diffusion coefficient than that of As, P can be diffused more uniformly than As.

Figure 22:
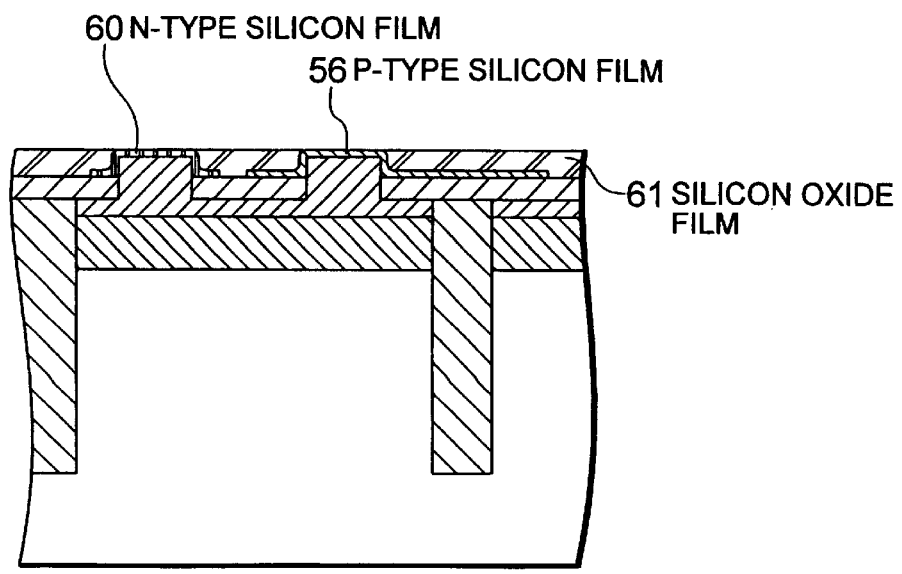
FIG. 22 is a sectional view showing a fabrication step of the npn bipolar transistor according to the first embodiment of the present invention.

As shown in FIG. 22, the silicon oxide film 61 is etched until the surfaces of the n-type silicon 60 and the p-type silicon film 56 are exposed using, e.g., hydrofluoric acid-based wet etching. This hydrofluoric acid-based wet etching is used so as not to leave large etching damages on the surfaces of the n-type silicon film 60 and the p-type silicon film 56. If etching damages to the surfaces of the n-type silicon film 60 and the p-type silicon film 56 are allowable, some other etching method such as RIE can be used.

Figure 23:
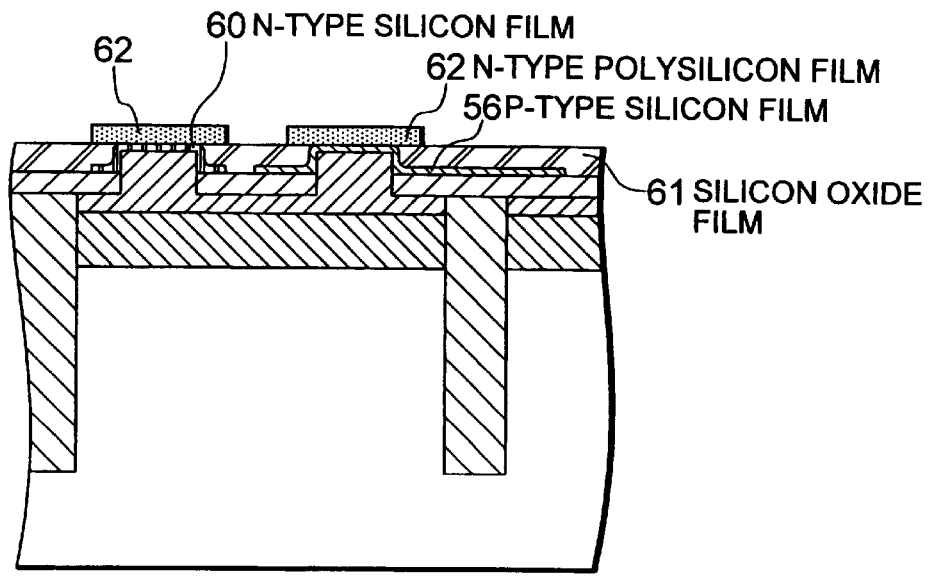
FIG. 23 is a sectional view showing a fabrication step of the npn bipolar transistor according to the first embodiment of the present invention.

Next, the step shown in FIG. 23 is performed. That is, CVD is used to form a polysilicon film about several hundred nm thick on the entire surface. An n-type impurity, e.g., As (arsenic) is doped into this polysilicon film by ion implantation. This As is activated by annealing to form an n-type polysilicon film 62 doped with the n-type impurity. Note that it is also possible to dope the n-type impurity when the polysilicon film is formed by CVD, instead of implanting the n-type impurity into the polysilicon film. Although P (phosphorus) is also usable as the n-type impurity, a finer emitter can be formed by As (arsenic) since the diffusion coefficient of As is smaller than that of P (phosphorus). In addition, a resist (not shown) patterned into a predetermined shape on the upper surface of the n-type polysilicon film 62 by exposure development is used as a mask to pattern the n-type polysilicon film 62 into a predetermined shape by anisotropic etching, e.g., RIE. This etching is performed such that the n-type polysilicon film 62 so remains as to be electrically connected to the n-type silicon film 60 or the p-type silicon film 56. In this etching step, the silicon oxide film 61 is used as an etching stopper.

Figure 24:
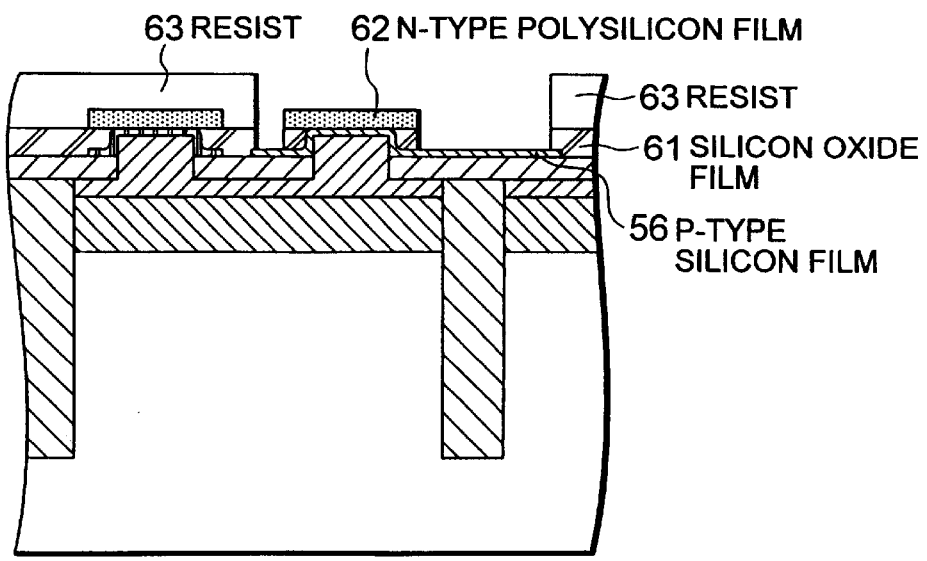
FIG. 24 is a sectional view showing a fabrication step of the npn bipolar transistor according to the first embodiment of the present invention.

The step shown in FIG. 24 is then performed. That is, spin coating is used to form a resist 63 about a few hundred nm to a few thousand nm in thickness on the entire surface. This resist 63 and the n-type polysilicon film 62 are used as masks to etch the silicon oxide film 61 by anisotropic etching, e.g., RIE. Consequently, the surface of the p-type silicon film 56 is partially exposed. In this etching, this p-type silicon film 56 is used as an etching stopper.

Figure 25:
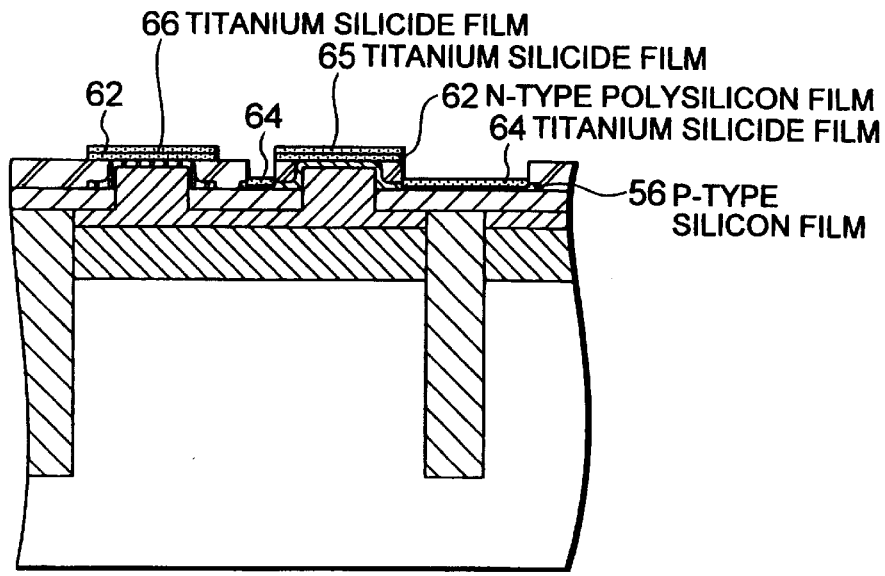
FIG. 25 is a sectional view showing a fabrication step of the npn bipolar transistor according to the first embodiment of the present invention.

As depicted in FIG. 25, the resist 63 is removed by ashing. A certain film formation step, e.g., sputtering is used to form a titanium film (not shown) about a few ten nm thick on the entire surface. This titanium film is reacted with the n-type polysilicon film 62 and with the p-type silicon film 56 by annealing. Consequently, titanium silicide films 64, 65, and 66 are formed. These titanium silicide films 64 to 66 have a larger resistance reducing effect than that of a polysilicon film. Annealing is performed again to remove an unreacted titanium film using a solution mixture of hydrogen peroxide water and sulfuric acid.

As shown in FIG. 26, CVD is used to form an insulating interlayer 67, e.g., a silicon oxide film, about a few hundred nm to a few thousand nm thick on the entire surface. Finally, a normal etching step and film formation step are performed to form metal interconnections 68, 69 and 70 made of, e.g., an aluminum film. These metal interconnections 68, 69, and 70 are connected to the titanium silicide films 64, 65, and 66, respectively.

The npn bipolar transistor shown in FIG. 26 is formed as described above. The arrangement of this npn bipolar transistor will be described below.

A base extraction electrode is constructed of the p-type silicon film 56 and the titanium silicide film 64. A base electrode is made of the metal interconnection 66. An emitter extraction electrode is made up of the n-type polysilicon film 62 and titanium silicide film 65 formed on the upper surface of the p-type silicon film 56. An emitter electrode is made of the metal interconnection 69. A collector extraction electrode is composed of the n-type silicon film 60, and the n-type polysilicon film 62 and titanium silicide film 66 formed on the upper surface of the n-type silicon film 60. A collector electrode is made of the metal interconnection 70.

Note that the effect of the present invention is obtainable even when the titanium silicide films 64, 65, and 66 are not formed by omitting the steps shown in FIGS. 24 and 25.

Note also that a pnp bipolar transistor can also be formed by switching the n- and p-types in the above process. Even in this case, an effect similar to that of this embodiment can be obtained.

In the npn bipolar transistor formed by this embodiment, the width of the active region 55 formed below the p-type silicon film 56 as a part of the base extraction electrode can be set to about 300 nm. The width of the active region 55 formed below the n-type silicon film 60 as a part of the collector extraction electrode can be set to about 800 nm. The width of the silicon oxide film 54 sandwiched between these active regions 55 can be set to about 1,600 nm. Furthermore, the distance to each of element isolation regions (not shown) so formed as to sandwich this npn bipolar transistor can be set to about 500 nm. In total, the width of the whole element can be set to about 3 to 4 µm in this embodiment.

Figure 1:
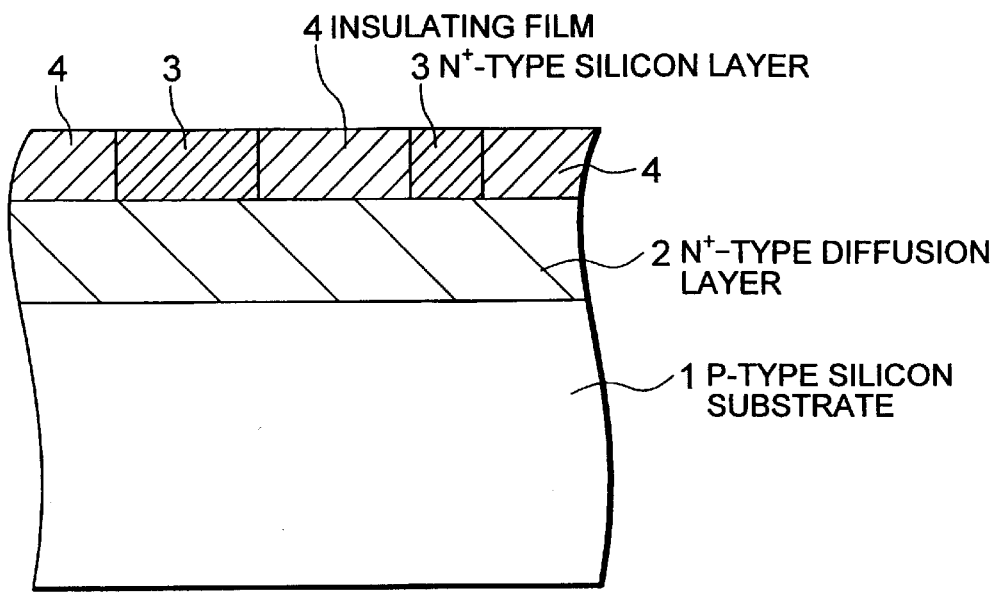
FIG. 1 is a sectional view showing a fabrication step of a conventional npn bipolar transistor.
Figure 2:
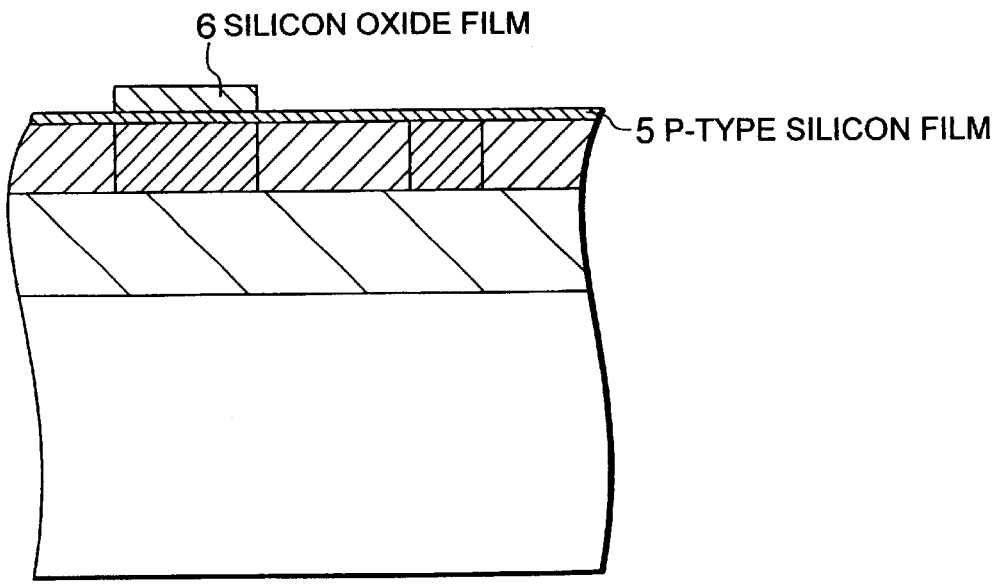
FIG. 2 is a sectional view showing a fabrication step of the conventional npn bipolar transistor.
Figure 3:
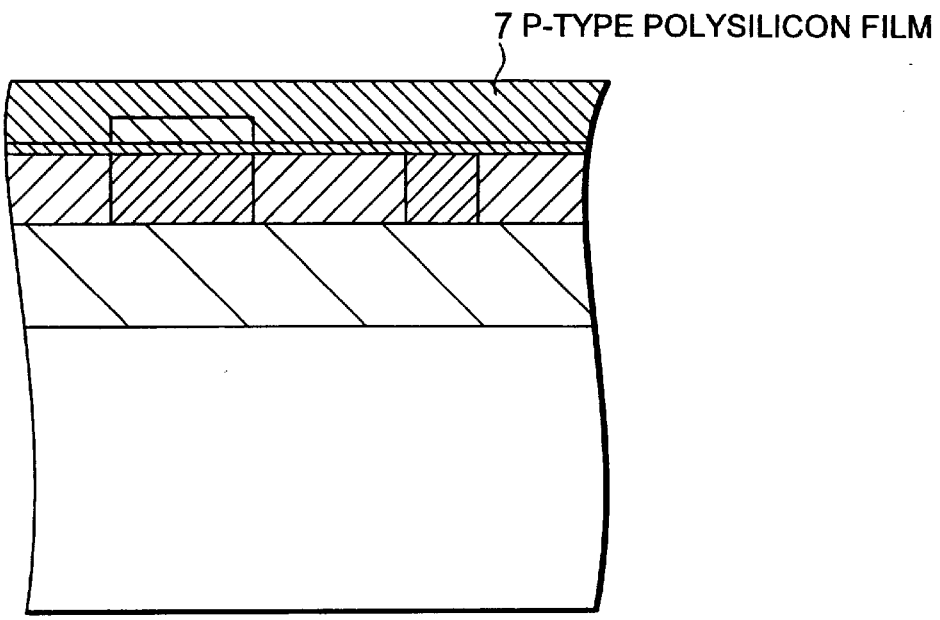
FIG. 3 is a sectional view showing a fabrication step of the conventional npn bipolar transistor.
Figure 4:
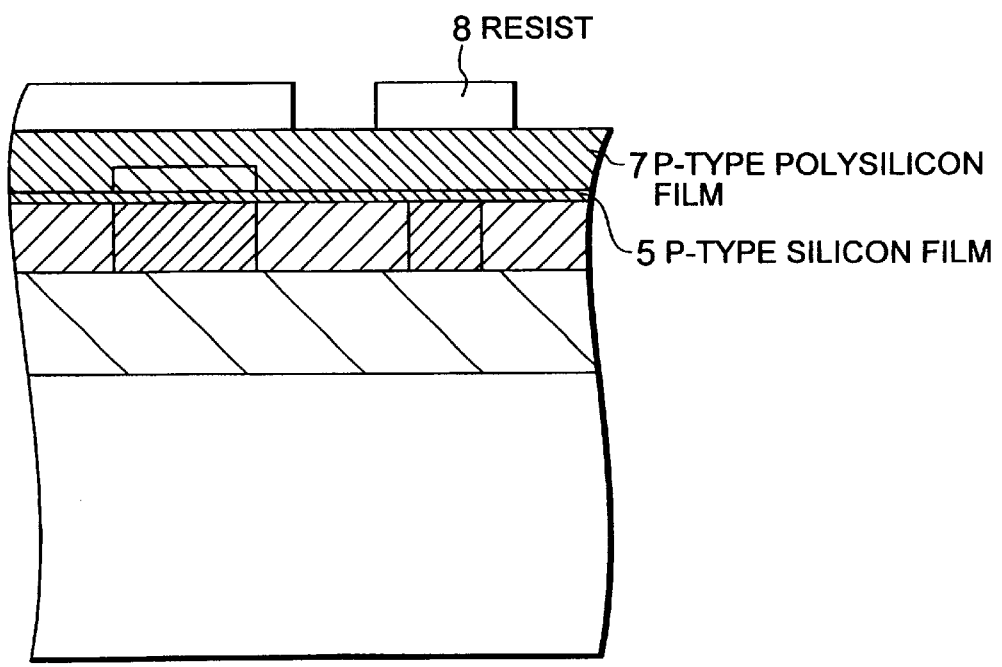
FIG. 4 is a sectional view showing a fabrication step of the conventional npn bipolar transistor.
Figure 5:
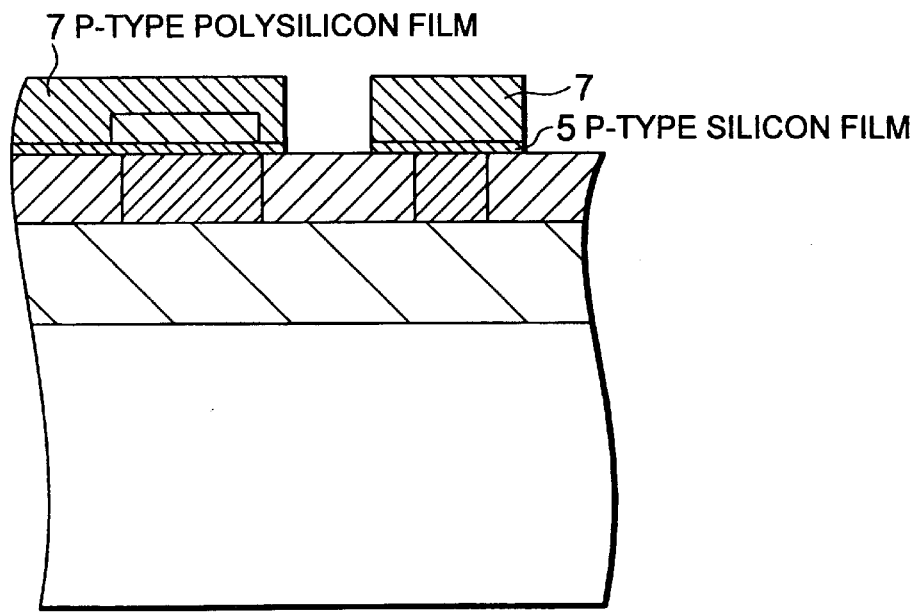
FIG. 5 is a sectional view showing a fabrication step of the conventional npn bipolar transistor.
Figure 6:
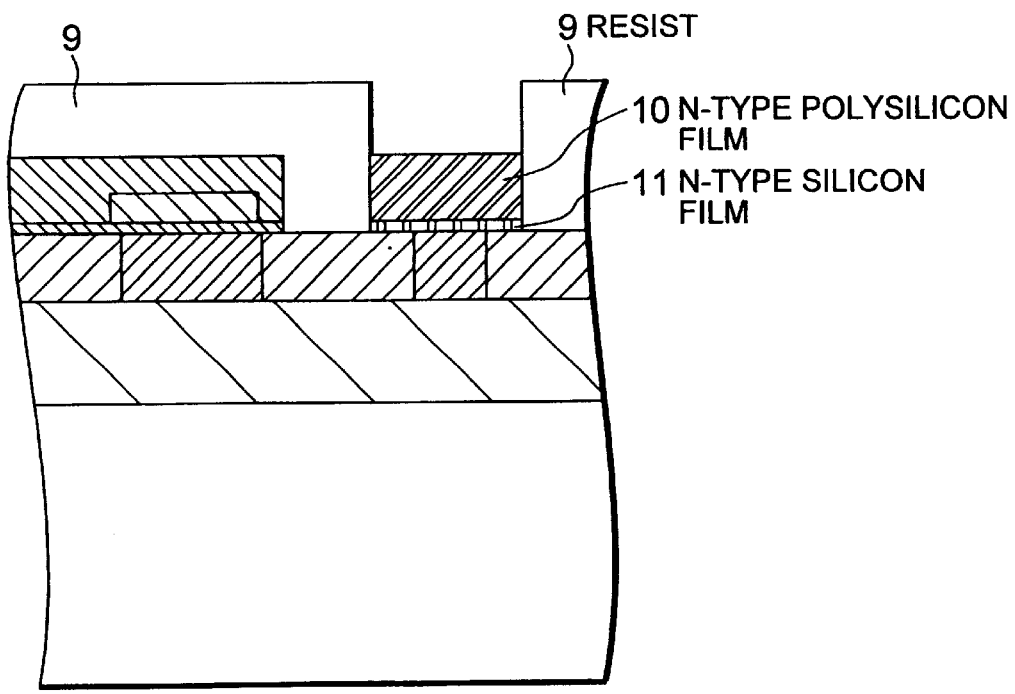
FIG. 6 is a sectional view showing a fabrication step of the conventional npn bipolar transistor.
Figure 7:
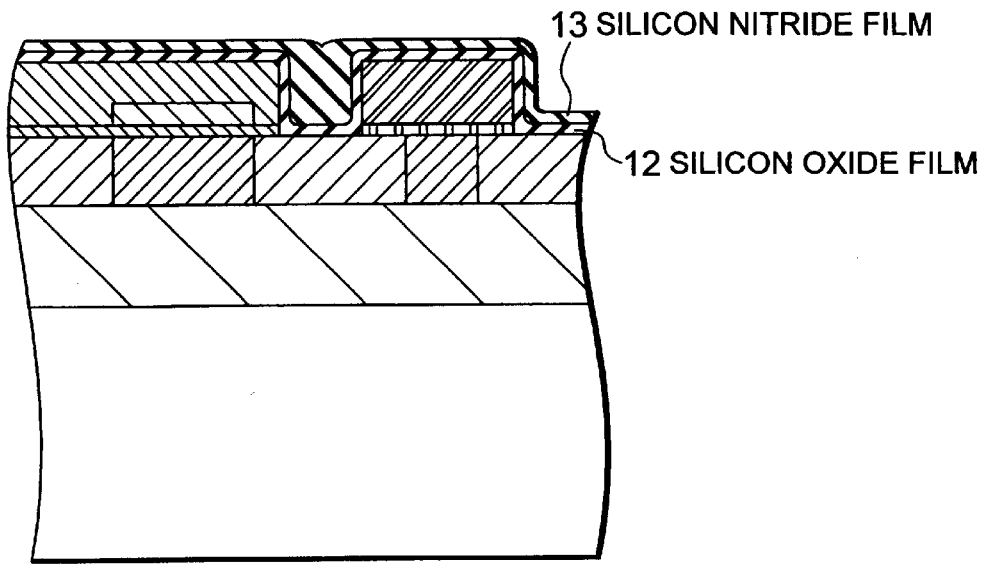
FIG. 7 is a sectional view showing a fabrication step of the conventional npn bipolar transistor.
Figure 8:
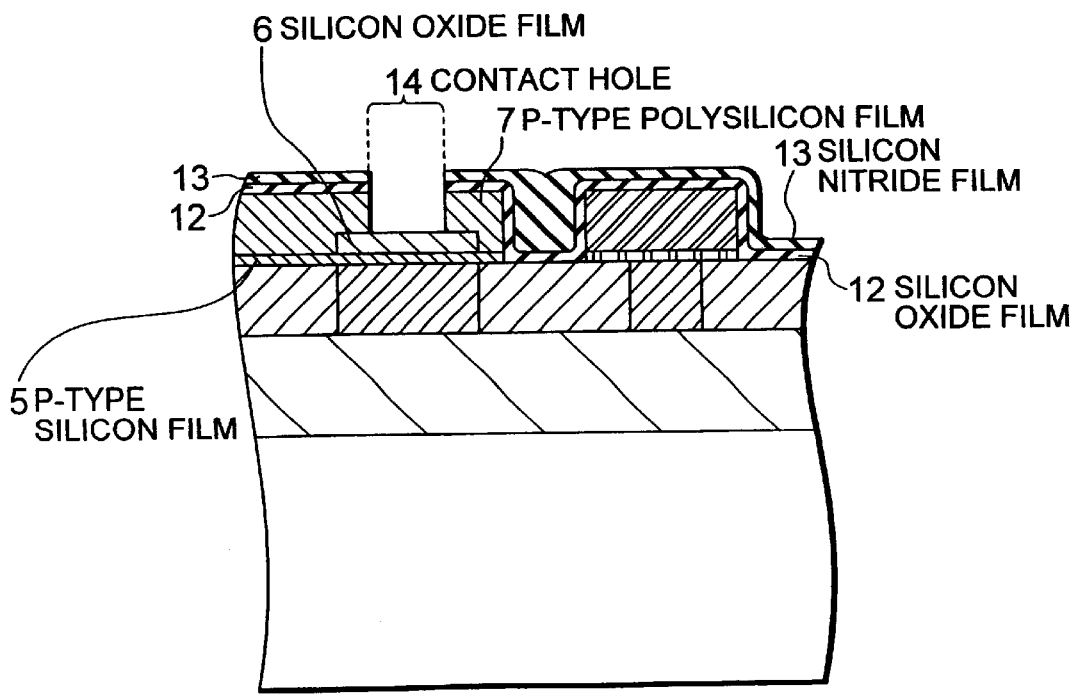
FIG. 8 is a sectional view showing a fabrication step of the conventional npn bipolar transistor.
Figure 9:
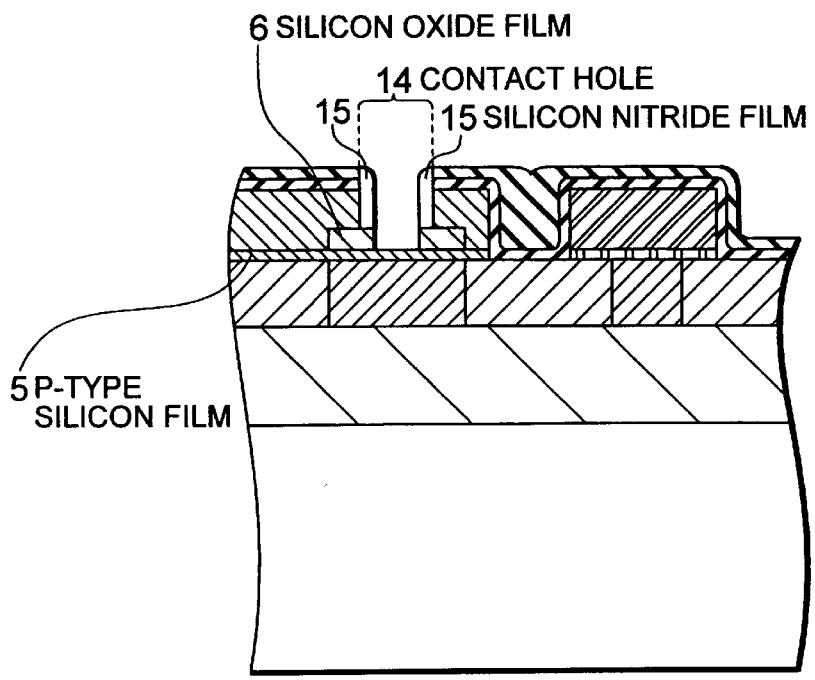
FIG. 9 is a sectional view showing a fabrication step of the conventional npn bipolar transistor.
Figure 10:
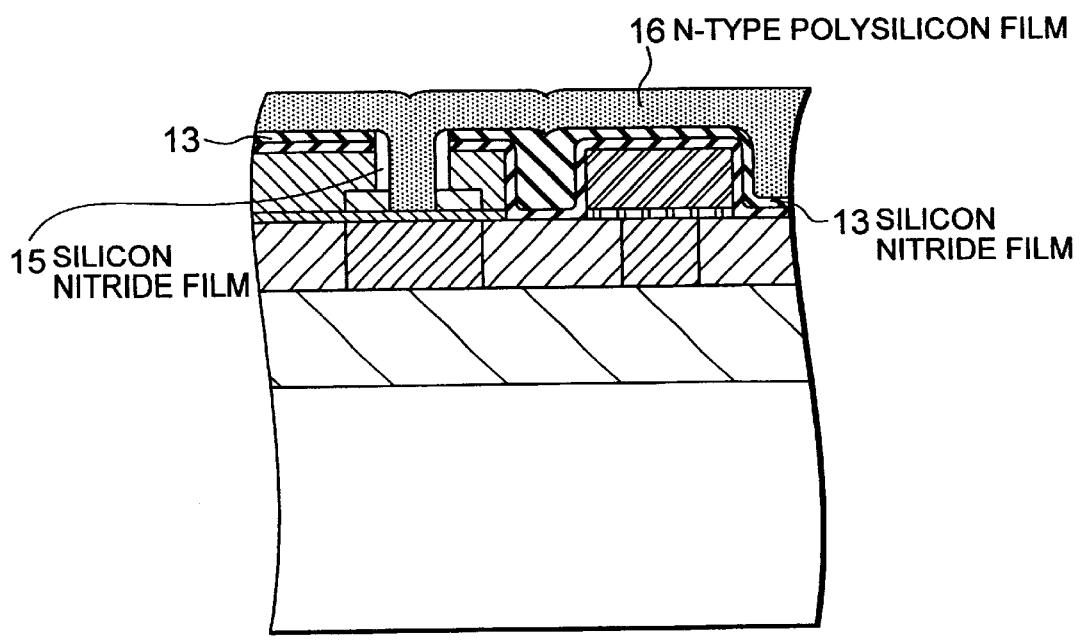
FIG. 10 is a sectional view showing a fabrication step of the conventional npn bipolar transistor.
Figure 11:
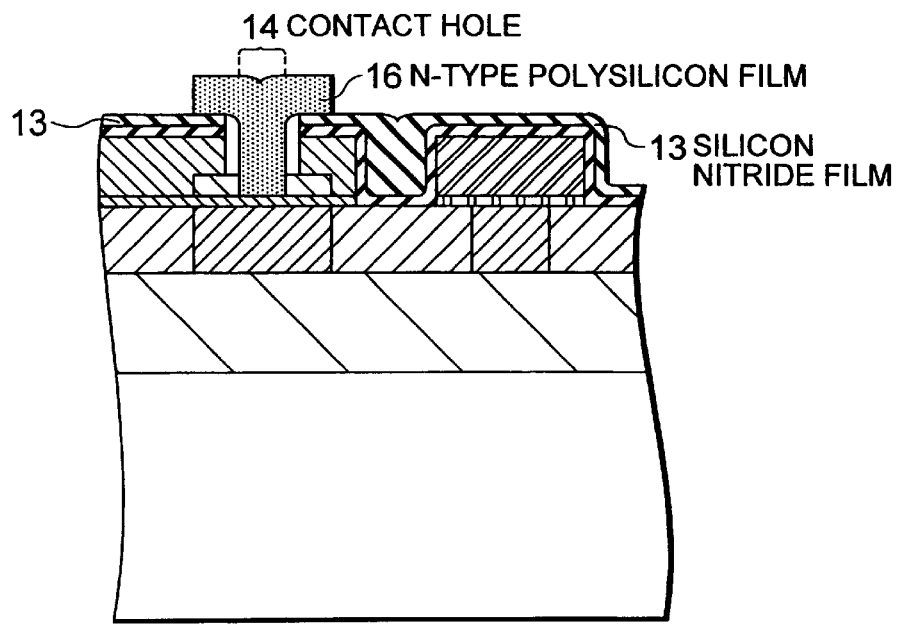
FIG. 11 is a sectional view showing a fabrication step of the conventional npn bipolar transistor.
Figure 12:
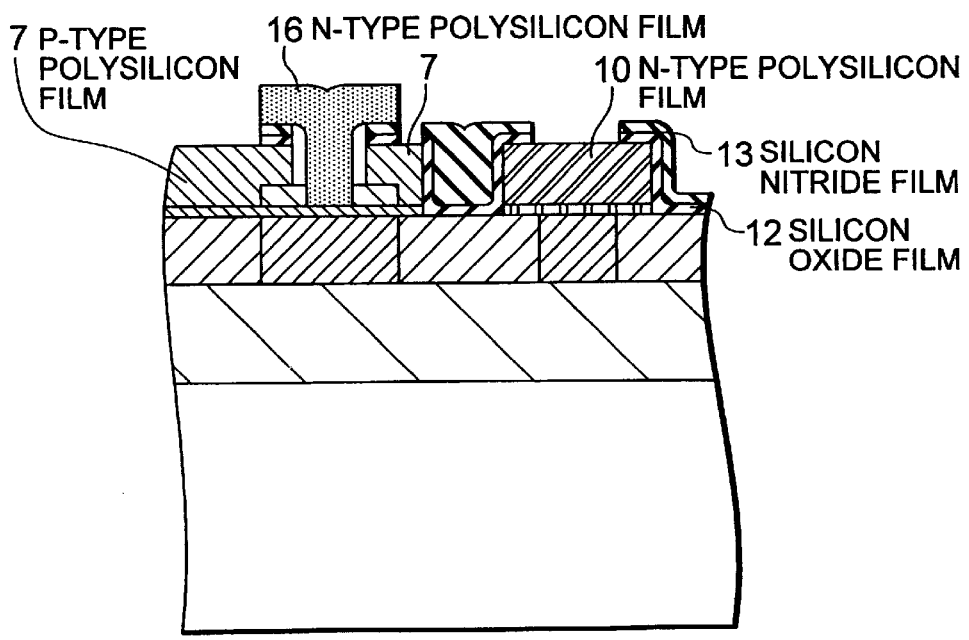
FIG. 12 is a sectional view showing a fabrication step of the conventional npn bipolar transistor.
Figure 13:
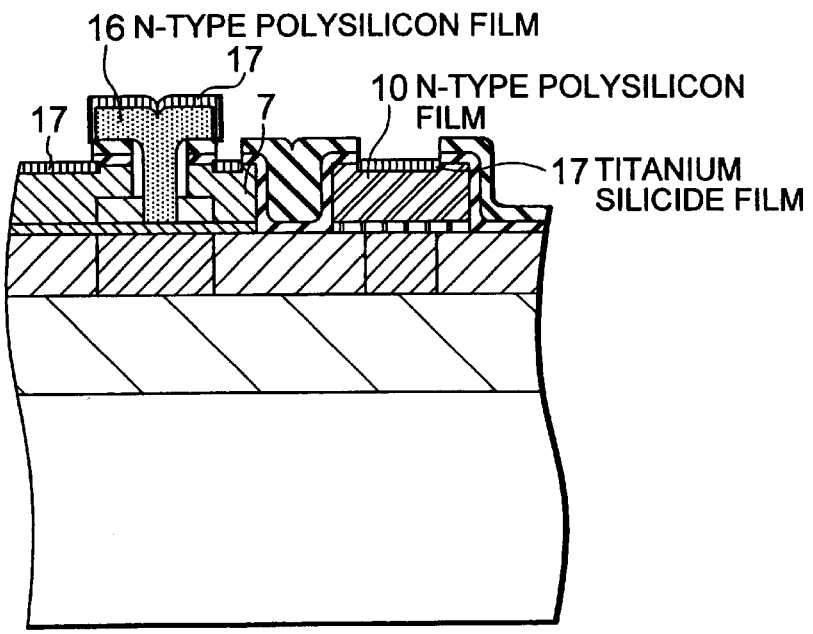
FIG. 13 is a sectional view showing a fabrication step of the conventional npn bipolar transistor.
Figure 14:
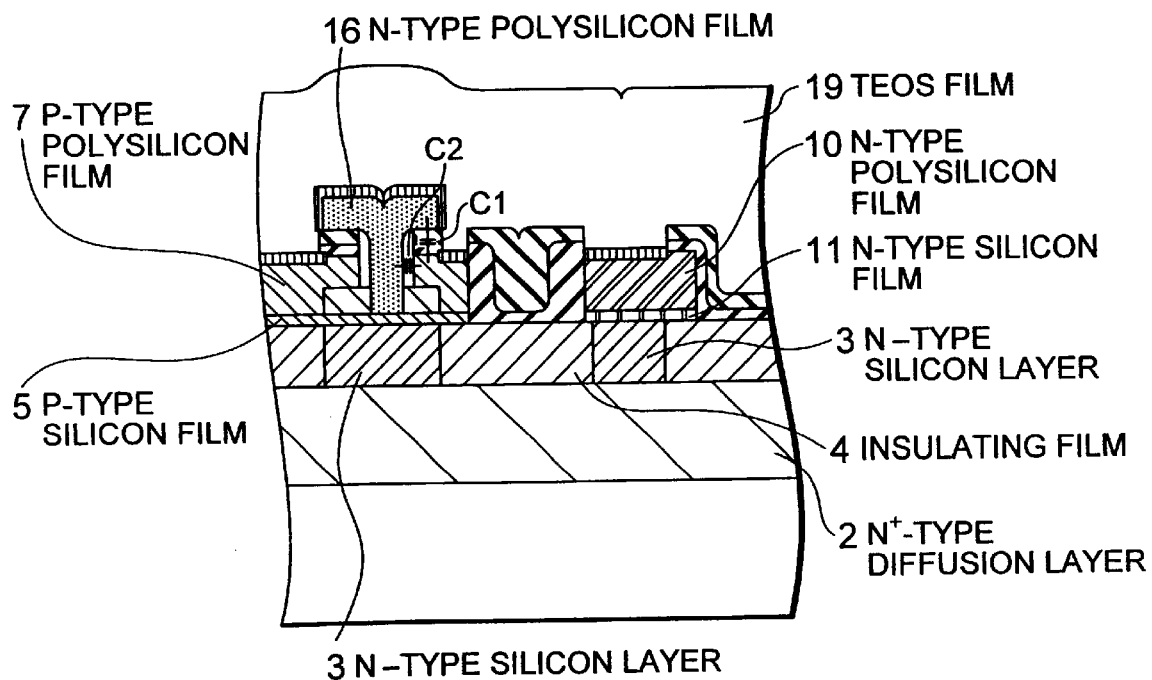
FIG. 14 is a sectional view showing a fabrication step of the conventional npn bipolar transistor.

Also, almost no such parasitic capacitances C1 and C2 as existing in the conventional device shown in FIG. 14 exist in this embodiment. In this conventional device, the distance between the n-type polysilicon 16 constructing the emitter extraction electrode and the p-type polysilicon film 7 constructing the base extraction electrode is short. Accordingly, the values of the parasitic capacitances C1 and C2 between these films are large.

In this embodiment, however, the distance between the n-type polysilicon film 62 serving as the emitter extraction electrode and the p-type silicon film 56 serving as the base extraction electrode is long. So, the parasitic capacitances are greatly reduced compared to the conventional device. As a consequence, the operating speed can be increased.

In this embodiment as described above, the emitter can be formed without any alignment. Conventionally, it is necessary to give some margin to the pattern widths by taking account of the alignment accuracy. In contrast, in the aforementioned first embodiment, the emitter can be formed without any alignment. This decreases the size of elements, reduces the consumption power, and increases the operating speed. Also, since the titanium silicide films 64, 65, and 66 are formed in the base, emitter, and collector, respectively, a low-resistance base, emitter, and collector can be obtained. Additionally, the resistance of the collector can be reduced by forming the n-type silicon layer 73 by epitaxial growth.

Furthermore, the first embodiment achieves high operating speed by reducing the parasitic capacitances.

The structure of a semiconductor device and a method of fabricating the same according to the second embodiment of the present invention will be described below with reference to FIGS. 27A to 27D.

Figure 27A:
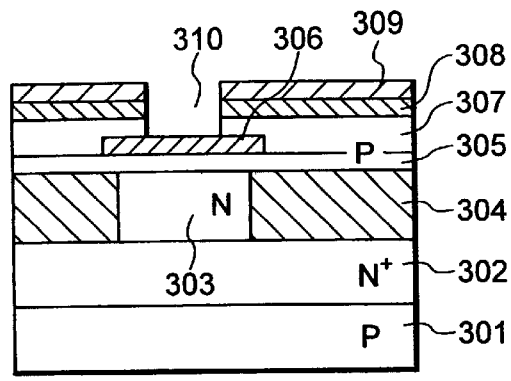
FIGS. 27A to 27D are longitudinal sectional views showing, in order of steps, the sectional structure of a semiconductor device and a method of fabricating the same according to the second embodiment of the present invention.

As shown in FIG. 27A, an n-type epitaxial layer 303 isolated by a silicon oxide film 304 is formed on the surface of a p-type semiconductor substrate 301 via an n$^+$-type buried layer 302. This n-type epitaxial layer 303 corresponds to an element region for forming a collector. A p-type silicon layer 305 doped with boron is formed on the surface of the n-type epitaxial layer 303 by epitaxial growth.

A silicon oxide film 306 is formed by thermal oxidation on a prospective emitter-base region on the silicon layer 305. A polysilicon layer 307 is formed on the surfaces of this silicon oxide film 306 and the silicon layer 305. Boron is ion-implanted into this polysilicon layer 307 to form a silicon oxide film 308 and a silicon nitride 309 in this order on the entire surface by CVD (Chemical Vapor Deposition). The photolithography and photoetching techniques are used to form a hole 310 in the polysilicon layer 307, the silicon oxide film 308, and the silicon nitride film 309.

Figure 27B:
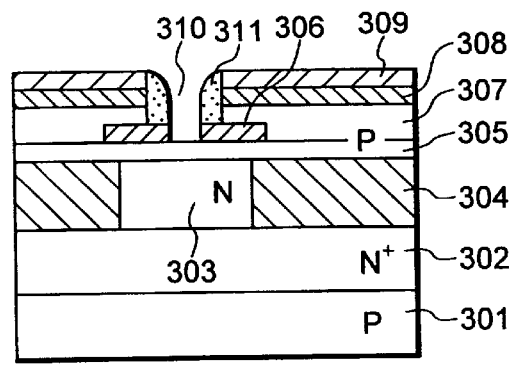
Figure 27C:
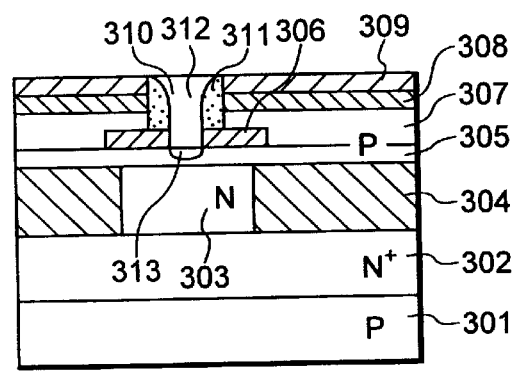

A silicon nitride film is formed on the entire surface and etched back by anisotropic etching. Consequently, as shown in FIG. 27B, a silicon nitride film 311 is left only on the side walls of the hole 310. Etching is performed using an NH$_4$F solution or the like to remove the silicon oxide film 306 from the bottom surface of the hole 310 and expose the surface of the silicon layer 305.

Next, selective epitaxial growth is performed on the surface of the silicon layer 305 to form an n-type epitaxial layer 312. This epitaxial layer 312 is formed at the same level as or below the surface of the silicon nitride film 309.

Alternatively, a polysilicon layer 312 heavily doped with arsenic is deposited on the surface of the silicon layer 305, and the arsenic is diffused through annealing to form an n-type emitter layer 313. This polysilicon layer 312 is planarized by etching back. Consequently, the polysilicon layer 312 is almost flush with the silicon nitride film 309.

In this structure, the polysilicon layer 307 is used as a base extraction electrode, and the polysilicon layer 312 is used as an emitter extraction electrode. The surface of the polysilicon layer 307 may be either higher or lower than the surface of the polysilicon layer 312.

In the conventional device shown in FIG. 14, the surface of the polysilicon film 16 is higher than the surface of the polysilicon film 10 as a base extraction electrode. Additionally, the polysilicon film 16 has a T-shaped section, and its end portion extends to the edge of the polysilicon film 10 as the base extraction electrode. Accordingly, the end portion of the polysilicon film 16 overlaps the polysilicon film 10 in the vertical direction of FIG. 14.

In contrast, in this embodiment, the polysilicon film 312 does not have a T shape. Therefore, the end portion of the polysilicon film 312 does not extend to the edge of the hole in the polysilicon film 307 and hence does not overlap the polysilicon film 10 in the vertical direction of FIG. 27C.

Figure 27D:
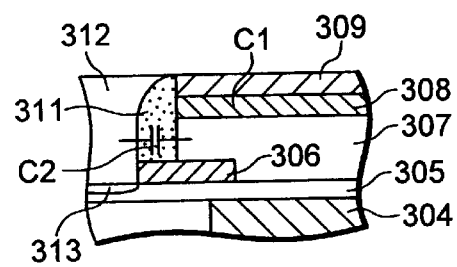

The second embodiment fabricated through the above steps has a sectional structure as shown in FIG. 27D. A parasitic capacitance C2 exists between the polysilicon layer 312 serving as the emitter extraction electrode and the polysilicon layer 307 serving as the base extraction electrode. However, no such capacitance C1 as existing in the conventional device shown in FIG. 14 exists. Hence, this embodiment increases the operating speed.

Figure 28A:
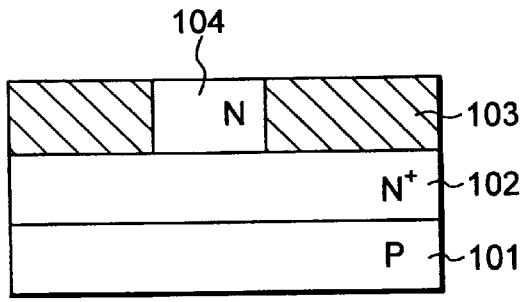
FIGS. 28A to 28E are longitudinal sectional views showing, in order of steps, the sectional structure of a semiconductor device and a method of fabricating the same according to the third embodiment of the present invention.

FIGS. 28A to 28E show the sectional structure of a semiconductor device and a method of fabricating the same according to the third embodiment of the present invention. As shown in FIG. 28A, an n$^+$-type heavily doped impurity layer 102 is formed on a p-type semiconductor substrate 101. On the surface of this n$^+$-type impurity layer 102, an n-type lightly doped impurity layer 104 whose impurity concentration is about $1 \times 10^{16}$ cm$^{-3}$ is formed by epitaxial growth. A trench is formed in an element isolation region of this impurity layer 104 by using the trench technique. A silicon oxide film 103 is buried in this trench by using the selective burying technique. Since the impurity layer 102 is connected to a collector contact (not shown), the impurity layer 104 forms a part of the collector.

Figure 28B:
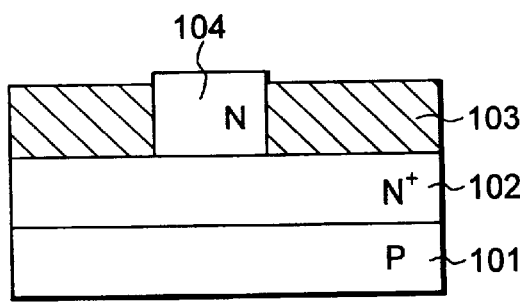

As shown in FIG. 28B, the exposed surface of the silicon oxide film 103 is etched away to expose the side surfaces of the impurity layer 104. In addition, an NH$_4$F solution or the like is used to continue the etching for about 1,000 Å to produce a step difference between the impurity layer 104 and the silicon oxide film 103.

Figure 28C:
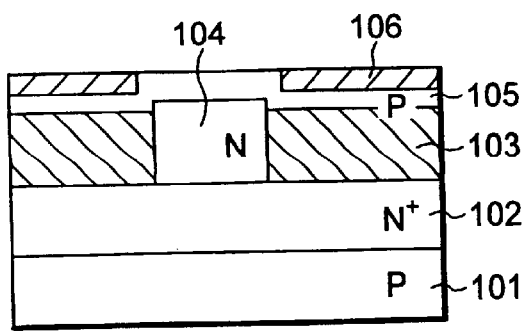

As FIG. 28C shows, unselective epitaxial growth is used to form a p-type silicon layer 105 having a film thickness of about 700 Å and a boron impurity concentration of about $4 \times 10^{18}$ cm$^{-3}$ on the entire surface. This silicon layer 105 corresponds to a base extraction electrode. A silicon oxide film 106 about 5,000 Å thick is formed on the surface of the silicon layer 105 by CVD. Etching back is performed until a portion of the surface of the silicon layer 105 on the impurity layer 104 is exposed.

Figure 28D:
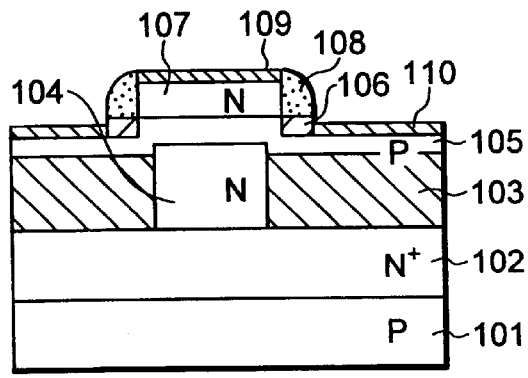

As depicted in FIG. 28D, an n-type silicon layer 107 is selectively formed only on the exposed surface of the silicon layer 105 by selective epitaxial growth. This silicon layer 107 has a film thickness of about 2,000 Å, is heavily doped with arsenic such that the impurity concentration is about $1 \times 10^{20}$ cm$^3$, and corresponds to an emitter extraction electrode.

On the entire surface, a silicon nitride film 108 about 2,000 Å thick is deposited by CVD. This silicon nitride film 108 is etched back by anisotropic etching to remain only on the side walls of the silicon layer 107. The silicon layer 107 and the silicon nitride layer 108 are used as masks to etch the silicon oxide film 106, exposing a portion of the surface of the silicon layer 105 located on the silicon oxide film 103. Next, metal silicidation is performed on the exposed surfaces of the silicon layers 105 and 107 to form, e.g., titanium silicide (TiSi$_2$) films 109 and 110. This reduces the surface resistance of the silicon layer 105 serving as the base extraction electrode and that of the emitter layer 107.

Figure 28E:
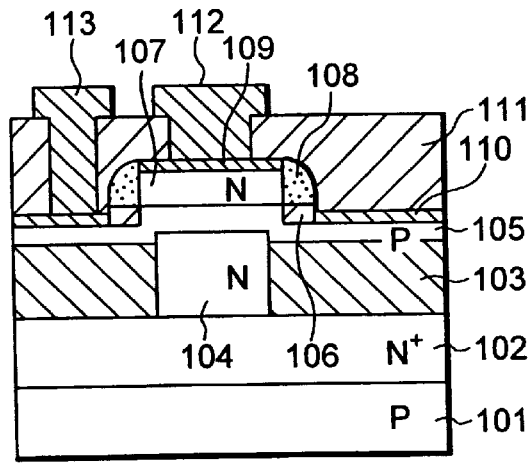

As illustrated in FIG. 28E, a silicon oxide film is deposited on the entire surface by CVD. Contact holes are formed on the surface of the silicon layer 107 as the emitter extraction electrode and on the silicon layer 105 as the base extraction electrode. Aluminum is deposited on the entire surface by sputtering and patterned by photolithography and etching. In this manner, an emitter electrode 112 and a base electrode 113 are formed, and a bipolar transistor is completed.

In the third embodiment as described above, the silicon layer 105 serving as a base region is formed in a region including the surface of the impurity layer 104 serving as an element region by unselective epitaxial growth. The silicon layer 107 serving as an emitter region is also formed by selective epitaxial growth. Consequently, the base and emitter regions can be formed to be self-aligned with the element region. Since no alignment margin is necessary, the element area can be reduced. Additionally, unlike in the conventional device shown in FIG. 14 in which the parasitic capacitances C1 and C2 exist, no such parasitic capacitances exist in this third embodiment. This achieves high operating speed.

The fourth embodiment of the present invention will be described below with reference to FIGS. 29A to 29E. In the above third embodiment, after the n-type lightly doped impurity layer 104 is formed on the n$^+$-type heavily doped impurity layer 102, a trench is formed in the element isolation region, and the silicon oxide film 103 is buried in this trench. This silicon oxide film 103 is etched to produce a step difference between the impurity layer 104 and the silicon oxide film 103.

Figure 29A:
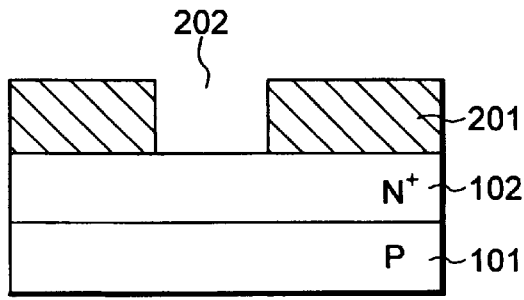
FIGS. 29A to 29E are longitudinal sectional views showing, in order of steps, the sectional structure of a semiconductor device and a method of fabricating the same according to the fourth embodiment of the present invention.

In this fourth embodiment as depicted in FIG. 29A, a silicon oxide film 201 is deposited on an n$^+$-type heavily doped impurity layer 102 by CVD. A hole 202 is formed in this silicon oxide film 201 by photolithography and etching.

Figure 29D:
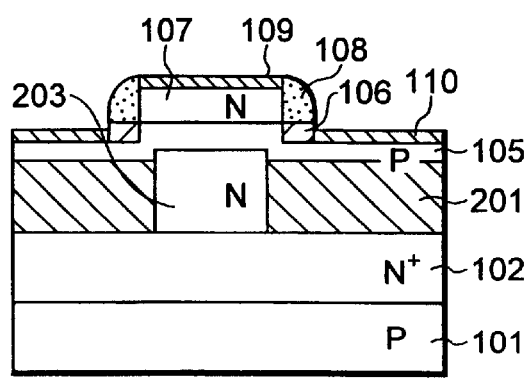
Figure 29B:
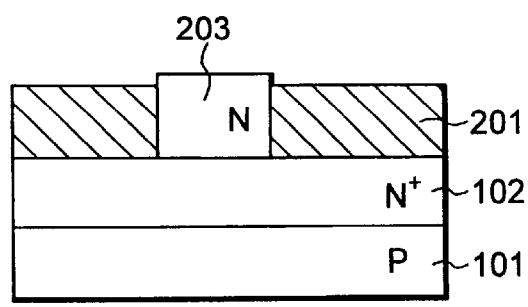
Figure 29E:
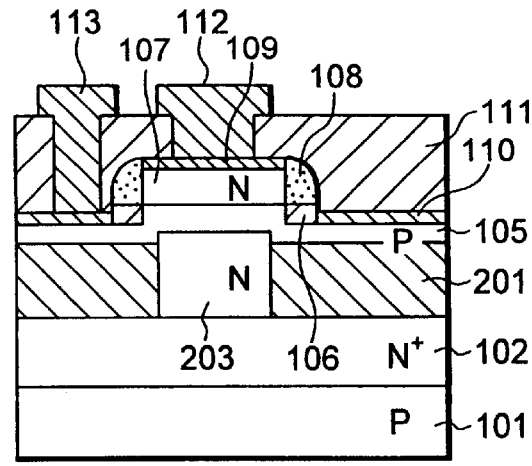
Figure 29C:
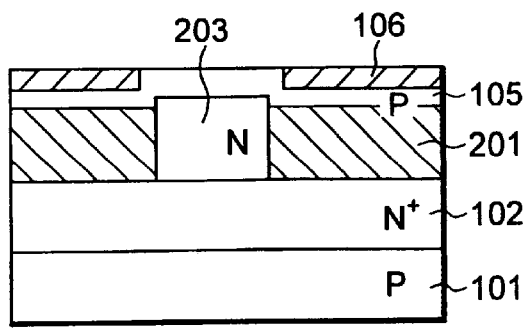

As shown in FIG. 29B, selective epitaxial growth is used to selectively form an n-type lightly doped impurity layer 203 only on the surface of the impurity layer 102 exposed to the bottom surface of the hole 202. In this step, the impurity layer 203 is so formed that the film thickness of this impurity layer 203 is larger than that of the silicon oxide film 201 to produce a step difference. Subsequent steps shown in FIGS. 29C to 29E are identical with those in the third embodiment described above, so a detailed description thereof will be omitted.

To form a base and an emitter so as to be self-aligned with an element region, it is important to produce a step difference between the n-type lightly doped impurity layer 104 and the silicon oxide film 103. In the above third embodiment, the etching amount of the silicon oxide film 103 must be controlled by time, resulting in slight difficulty of producing a desired step difference. Conversely, in this fourth embodiment a step difference can be produced by controlling the film thickness of the silicon layer 203 that is deposited on the bottom surface of the hole 202 by unselective epitaxial growth. Therefore, the controllability is higher than in the above third embodiment.

Each of the above embodiments is merely an example and hence does not restrict the present invention. For example, the material, film thickness, formation method, and the like of each film in each embodiment can be changed where necessary.

Also, if it is unnecessary to reduce the surface resistances of the silicon layers 105 and 107, no side walls of an insulating film need to be formed on the side surfaces of the silicon layer 107.

Additionally, a heterojunction transistor having high-frequency characteristics can be obtained by forming the silicon layer 105 as a base region by using single-crystal silicon containing a material, such as Ge, having a smaller bandgap than that of silicon, and forming the silicon layer 107 as an emitter region by using a material, such as C, having a larger bandgap than that of silicon.

Furthermore, as an emitter extraction electrode, the polysilicon film 62 is formed in the first embodiment, the epitaxial layer or the polysilicon layer 312 is formed in the second embodiment, and the epitaxial layer 107 is formed in the third and fourth embodiments. An epitaxial layer has a lower resistance value than that of a polysilicon layer. Accordingly, the emitter resistance and therefore noise can be reduced more by forming an emitter extraction electrode using an epitaxial layer.

What is claimed is:

1. A semiconductor device comprising:
    a semiconductor substrate of one conductivity type having a semiconductor layer of an opposite conductivity type from an upper surface to a first depth;
    a collector layer of the opposite conductivity type formed on the surface of said semiconductor substrate;
    a base extraction electrode of one conductivity type formed on a surface of said collector layer and having a hole formed to a second depth; and
    an emitter extraction electrode of the opposite conductivity type buried in said hole of said base extraction electrode with an insulating film being formed on side surfaces of said hole,
    wherein an end portion of said emitter extraction electrode does not extend to an edge of said hole in said base extraction electrode.

2. A device according to claim 1, wherein said emitter extraction electrode includes an epitaxial layer.

3. A device according to claim 1, wherein an upper surface of said emitter extraction electrode is not higher than an upper surface of said base extraction electrode.

4. A device according to claim 3, wherein said emitter extraction electrode includes an epitaxial layer.

5. A semiconductor device comprising:
    a semiconductor substrate of one conductivity type having a semiconductor layer of an opposite conductivity type from an upper surface to a predetermined depth and a projection on said semiconductor layer of the opposite conductivity type;
    a first insulating film formed on an upper surface of said semiconductor substrate of one conductivity type from a portion except for said projection to a predetermined level not reaching an upper surface of said projection;
    a semiconductor film of one conductivity type formed on at least the upper surface of said projection; and
    a semiconductor film of the opposite conductivity type formed on at least an upper surface of said semiconductor film of one conductivity type.

6. A semiconductor device comprising:

a semiconductor substrate of one conductivity type having a semiconductor layer of an opposite conductivity type from an upper surface to a predetermined depth and first and second projections on said semiconductor layer of the opposite conductivity type;

a first insulating film formed on an upper surface of said semiconductor substrate of one conductivity type from a portion except for said first and second projections to a predetermined level not reaching upper surfaces of said first and second projections;

a semiconductor film of one conductivity type formed on at least the upper surface of said first projection;

a first semiconductor film of the opposite conductivity type formed on at least the upper surface of said second projection; and a second semiconductor film of the opposite conductivity type formed in a predetermined position on an upper surface of said semiconductor film of one conductivity type.

7. A semiconductor device comprising:

a first insulating film formed in an element isolation region on a semiconductor substrate;

a collector layer of a first conductivity type formed in an element region on said semiconductor substrate and having a surface higher than that of said first insulating film;

a first semiconductor layer of a second conductivity type formed on the surfaces of said first insulating film and said collector layer;

a second insulating film formed on a portion of the surface of said first semiconductor layer located on said first insulating film; and a second semiconductor layer of the first conductivity type formed on a portion of the surface of said first semiconductor layer located on said collector layer.

8. A device according to claim 7, wherein said first semiconductor layer is formed using single-crystal silicon containing a hetero material having a smaller bandgap than that of silicon, and said second semiconductor layer is formed using single-crystal silicon containing a hetero material having a larger bandgap than that of silicon.

\* \* \* \* \*